United States Patent
Williams

(10) Patent No.: US 10,957,621 B2
(45) Date of Patent: Mar. 23, 2021

(54) HEAT SINK FOR A POWER SEMICONDUCTOR MODULE

(71) Applicant: AVID CONTROLS, INC., Waller, TX (US)

(72) Inventor: Kevin R. Williams, Waller, TX (US)

(*) Notice: Subject to any disclaimer, the term of this patent is extended or adjusted under 35 U.S.C. 154(b) by 0 days.

(21) Appl. No.: 16/806,236

(22) Filed: Mar. 2, 2020

(65) Prior Publication Data

US 2020/0279789 A1 Sep. 3, 2020

Related U.S. Application Data

(63) Continuation-in-part of application No. 16/377,637, filed on Apr. 8, 2019, and a continuation-in-part of application No. 14/722,569, filed on May 27, 2015, now abandoned.

(60) Provisional application No. 62/005,455, filed on May 30, 2014.

(51) Int. Cl.
| | | |
|---|---|---|
| *H01L 23/46* | (2006.01) | |
| *H01L 23/367* | (2006.01) | |
| *H01L 21/48* | (2006.01) | |
| *H01L 23/373* | (2006.01) | |
| *F28F 3/02* | (2006.01) | |

(52) U.S. Cl.
CPC .......... *H01L 23/3677* (2013.01); *F28F 3/022* (2013.01); *H01L 21/4871* (2013.01); *H01L 23/3675* (2013.01); *H01L 23/373* (2013.01); *H01L 23/46* (2013.01)

(58) Field of Classification Search
CPC .................................................. H01L 23/3677
USPC ........................................................... 438/26
See application file for complete search history.

(56) References Cited

U.S. PATENT DOCUMENTS

| | | | | |
|---|---|---|---|---|
| 6,134,783 A | * | 10/2000 | Bargman | B21C 23/20 29/890.03 |
| 6,729,383 B1 | * | 5/2004 | Cannell | F28F 3/022 165/185 |
| 6,830,960 B2 | * | 12/2004 | Alcoe | H01L 23/367 257/678 |
| 6,879,486 B1 | * | 4/2005 | Banton | H05K 7/20563 165/185 |
| 2002/0018338 A1 | * | 2/2002 | McCullough | H01L 21/4882 361/709 |
| 2004/0032718 A1 | * | 2/2004 | Self | H01L 23/467 361/703 |
| 2004/0150956 A1 | * | 8/2004 | Conte | H01L 23/3677 361/709 |
| 2006/0021736 A1 | * | 2/2006 | Tran | F28F 3/022 165/80.3 |
| 2008/0066888 A1 | * | 3/2008 | Tong | H01L 23/3677 165/80.3 |

(Continued)

*Primary Examiner* — Stanley Tso
(74) *Attorney, Agent, or Firm* — Egbert, McDaniel & Swartz, PLLC

(57) ABSTRACT

A power semiconductor module has a base plate with a heat sink affixed thereto, a housing affixed to the base plate, a DC busbar affixed to the base plate and to the housing, an AC busbar affixed to the base plate and to the housing on a side of the housing opposite the DC busbar, and control electronics positioned in an interior of the housing and connected to the DC busbar and to the AC busbar. The heat sink has a plurality of pins affixed to one side of the base plate and extending outwardly therefrom. Each of the plurality of pins is of a forged or impact extruded pure aluminum material.

3 Claims, 7 Drawing Sheets

(56) References Cited

U.S. PATENT DOCUMENTS

| | | | | |
|---|---|---|---|---|
| 2009/0284927 | A1* | 11/2009 | Li | H01L 23/3677 |
| | | | | 361/704 |
| 2012/0217628 | A1* | 8/2012 | Chou | H01L 23/473 |
| | | | | 257/692 |
| 2013/0199767 | A1* | 8/2013 | Karidis | B23K 31/02 |
| | | | | 165/185 |
| 2014/0231057 | A1* | 8/2014 | Schalansky | F28F 3/048 |
| | | | | 165/169 |
| 2015/0327353 | A1* | 11/2015 | Dickover | H01L 23/4338 |
| | | | | 361/679.54 |
| 2015/0327394 | A1* | 11/2015 | Davis | H01L 23/3677 |
| | | | | 361/720 |

* cited by examiner

HEAT SINK FOR A POWER SEMICONDUCTOR MODULE

CROSS-REFERENCE TO RELATED APPLICATIONS

The present application is a continuation-in-part of U.S. patent application Ser. No. 16/377,637 filed on Apr. 8, 2019, and entitled "Corrosion Resistant Power Semiconductor Module", presently pending. The present application is also a continuation-in-part of U.S. patent application Ser. No. 14/722,569, filed on May 27, 2015 and entitled "Liquid-Cooled Heat Sink Device", presently pending. U.S. patent application Ser. No. 14/722,569 claimed priority from U.S. Provisional Patent Application Ser. No. 62/005,455, filed on May 30, 2014, and entitled "Liquid Cooled Heat Sink and Manufacturing Method for the Same".

STATEMENT REGARDING FEDERALLY SPONSORED RESEARCH OR DEVELOPMENT

Not applicable.

NAMES OF THE PARTIES TO A JOINT RESEARCH AGREEMENT

Not applicable.

INCORPORATION-BY-REFERENCE OF MATERIALS SUBMITTED ON A COMPACT DISC

Not applicable.

BACKGROUND OF THE INVENTION

1. Field of the Invention

The present invention relates to power semiconductor modules. More particularly, the present invention the relates to heat sinks for use in association with such power semiconductor modules. Furthermore, the present invention relates to pin arrays used in heat sinks for power semiconductor modules.

2. Description of Related Art Including Information Disclosed Under 37 CFR 1.97 and 37 CFR 1.98

The application of power semiconductor modules and power converter circuits is often applied in applications, such as wind energy, where the current produced by the generators is temporarily variable. For power outputs of up to one megawatt and more, generators with up to 690 volts are used. This means that the voltage in the intermediate circuit, or in the DC connection to the power converter, lies in about 1000 to 1100 volts. In the associated power converter circuits, IGBTs (insulated gate bipolar transistors) are often used as power switches and their associated silicon voltage are 1200 volts or 1700 volts depending on the system AC voltage. However, these intermediate circuit voltages of 1100 volts are too low for higher power outputs. Since transmission losses increase as the square of the current, higher voltages, which reduce the current, reduce losses. The lower voltages of 1100 volts or so result in excess losses, for example in power lines. For that reason, medium-voltage generators of the standardized voltage classes of 2.2 kV, 3.3 kV, 4.16 kV and 6.3 kV are used in power generation with outputs starting in about six (6) megawatts. The resulting high intermediate circuit voltages require high-voltage power switches such as IGBTs or IGCTs (integrated gate commutative thyristors). However, these high-voltage versions have the disadvantage that power losses are higher by a factor of 3 to 10 in comparison with the standard versions.

The generators used for the above-mentioned technologies are asynchronous machines. These robust generators require four-quadrant converters, since for excitation, these generators need an input current which regulated via the four-quadrant transformation. A particular product that has shown success in association with wind farms and the production of large amounts of energy from wind energy generators is the Skiip 4 of Semikron. The Skiip 4 is an intelligent power module with the highest power density and reliability. This intelligent integrated power module means that three perfectly matched components are integrated into one integrated power module. These components include the heatsink, the power section and the gate driver. The power section can include three half-bridge modules in parallel, four half-bridge modules in parallel, or six half-bridge modules in parallel. The chips themselves are sintered, not soldered. The sintering is based on pulverized silver which forms a material connection when pressure and temperature are applied. This sintering process connects the chip and DCB surface and is extremely stable up to the melting point of silver at 962° C. Contact springs are used for all of the auxiliary contacts (gate, auxiliary emitter and temperature sensor). These spring contacts allow the solder-free connection of the driver board. The task of the gate driver is both to transfer incoming signals into powerful output signals in order to control the IGBT and to ensure signal isolation between high and low voltage sides of the driver board.

FIGS. 1 and 2 are illustrations of the prior art Skiip 4 of Semikron. As can be seen in FIGS. 1 and 2, the power semiconductor module 10 has a base plate 12 and a housing 14 affixed to the base plate. A lid 16 is affixed to the housing 14 at the top thereof. The lid 16 has a plurality of holes 18 that open therethrough and into the interior of the housing 14. The control electronics are located within the interior of the housing. A DC busbar 20 is affixed to the base plate 12 and affixed to the housing 14. The control electronics are connected to the DC busbar 20. A plurality of supports 22 extend upwardly from the base plate 12 and support the DC busbar 20. A plurality of bays 24 are located between the plurality of supports 22 and the DC busbar. A connector 26 is located at the top of the lid 16 and supports a connector 26 for connection to the control electronics.

FIG. 2 shows that there is an AC busbar 28 located on the side of the housing 14 opposite the DC busbar 20. Heatsink mountings 30 are positioned on the base plate 12 and support the AC busbar 28. The heatsink mountings 30 serves to transfer heat away from the control electronics. If necessary, water can flow through the heatsink mounting 30 so as to provide a cooling effect. The plurality of holes 32 are also formed on the lid 16 and open to the interior of the housing 14 and the control electronics. Various plugs 34 are also mounted to the side of the housing 14.

In the illustrations of FIGS. 1 and 2, the Skiip 4 has several openings to the interior of the housing. It was felt necessary, in the prior art, to provide these openings so as to allow an airflow to the control electronics. This is important because of the high capacity of the electronics connected to the control electronics within the interior of the power semiconductor module. In particular, in normal use, the IGBTs will create a great deal of heat. It was felt in the prior art that if this heat were not removed by airflow, then this heating of the IGBTs could shorten the life of the IGBTs and hence the power semiconductor module. Specifically, airflow openings are formed in the seams between the housing 14 and the base plate 12, through the holes 18, through the holes 32, through the seams between the AC side heatsink mountings, through the seams around the hole of the connector 26, and through various other seams and openings. Unfortunately, whenever the ambient air enters the interior of the power semiconductor module 10, there is the possibility of condensation occurring within the power semiconductor module. Also condensation appears on the heat sink due to the relative humidity and delta temperature of coolant and ambient heat plate temperature.

In the past, various patents have issued to Semikron with respect to such power semiconductor modules. In particular, U.S. Pat. No. 6,680,856, issued on Jan. 20, 2004 to D. Schreiber, teaches a power converter circuit arrangement for generators with dynamically variable power output. In particular, this power converter circuit is for wind power devices which feed into a high-voltage grid consisting of a power converter circuit arrangement to transform the variable frequency and variable voltage alternating current generated in the AC voltage generator into DC. The DC is chopped to again produce AC but with a fixed frequency and voltage. The power converter has a cascaded serial arrangement of several power converter cells. The power converter cells are made dynamically active or inactive by the master control unit, depending on the power being generated by the AC voltage generator.

U.S. Pat. No. 7,324,359, issued on Jan. 29, 2008 to D. Schreiber, teaches a converter circuit for a wind power system for supplying a high-voltage direct voltage connection. This system includes a transformer with one primary winding per phase and a plurality of secondary windings per phase. Each of the secondary windings of different phases are connected to each rectifier cell. These rectifier cells are connected to one another by their inputs and outputs. The rectifier cells themselves each include one input rectifier and two series-connected upward converters, and the center tap of the secondary winding of the transformer is connected to the center points of the series circuit of the upward converters.

U.S. Pat. No. 8,026,699, issued on Sep. 27, 2011 to D. Schreiber, shows a frequency converter circuit for a double-fed asynchronous generator with a variable power output, which can be connected to a voltage network containing a rotor rectifier and which can be connected to the rotor of the asynchronous generator. A network frequency converter is connected to the voltage network. An intermediate circuit contains a semiconductor switch arranged on the rotor rectifier, an intermediate circuit capacitor or arranged on the network frequency converter, and a diode arranged between the semiconductor switch and the intermediate circuit capacitor.

U.S. Patent Application Publication No. 2003/0214770, published on Nov. 20, 2003 to Schimanek et al., discloses a method and circuit arrangement with adaptive overload protection for power switching devices. Dynamic thresholds for power circuit switch operation are calculated in real-time using instantaneous operating parameter measurements. The dynamic thresholds are self-adapting and are used to provide shutdown criteria independent of switch control systems. A characteristics field containing information related to operation parameters is used to make overload evaluations in real-time. These dynamic overload evaluations allow complete protection against thermal overload for entire power circuits in addition to power components. The power circuit output profile can be modified in response to dynamic overload evaluation, thus preventing overload shutdown or damage to components, while operating at optimal efficiency.

U.S. Patent Application Publication No. 2004/0245548, published on Dec. 9, 2004 to Stockmeire et al., teaches a power semiconductor module that has a baseplate comprising a frame-like housing, a cap, and at least one electrically insulated substrate disposed inside the housing. The substrate comprises an insulation body with a plurality of metal connection tracks located thereon and insulated from one another. Power semiconductor components are located on the connection tracks. Terminal elements lead to the outside of the power semiconductor module for load and auxiliary contacts. Some of these terminal elements in the interior of the power semiconductor module comprise contact springs, which are disposed between the connection tracks and the contact points on a printed circuit board. The printed circuit board has conductor tracks which connect the contact points to the contact elements that lead to the outside of the power semiconductor module.

U.S. Patent Application Publication No. 2008/0007973, published on Jan. 10, 2008 to D. Schreiber, provides a power converter circuit for converting a multi-phase alternating current into a high-voltage direct voltage and then into a second multiphase alternating voltage. The circuit comprises first and second cascades of power converter cells, each cascade having first terminals on a transformer side and second terminals on a direct voltage side. The first cascade is a serial arrangement of first power converter cells. The second cascade is a serial arrangement of second power converter cells. Each second power converter cell is embodied with a three-phase bridge circuit connected by first terminals to a transformer and with an intermediate circuit.

These power semiconductor modules that are becoming more powerful with increased capabilities. These devices resulted more heat been generated. The heat is being concentrated in a smaller unit volume and mass area. Traditionally, aluminum extrusions and stamped sheet metal parts have been used to cool some such power semiconductors. Air has been commonly used as the cooling medium. It has been long recognized that increasing the surface area of such devices improves the cooling performance.

In electronic systems, the heat sink is a passive heat exchanger that cools a device by dissipating heat into the surrounding medium. In computers, heat sinks are used to cool central processing units or graphics processors. Heat sinks are used with high-power semiconductors such as power transistors and optoelectronics, such as lasers and light-emitting diodes, where the heat dissipation ability of the basic device is insufficient to moderate its temperature.

The heat sink is designed to maximize its surface area in contact with the cooling medium surrounding it, such as air. Air velocity, choice of material, protrusion design and surface treatment are factors that affect the performance of a heat sink. Heat sink attachment methods and thermal interface materials also affect the die temperature of the integrated circuit. Thermal adhesives or thermal greases improve the capability of the heat sink by filling air gaps between the heat sink and the heat spreader of the device.

The heat sink will transfer thermal energy from a higher temperature device to a lower temperature fluid medium. The fluid medium is frequently air, but can also include water, refrigerants or oil. If the fluid medium is water, the heat sink is commonly called a cold plate. In thermodynamics, the heat sink is a heat reservoir that can absorb an arbitrary amount of heat without significantly changing temperature. Practical heat sinks for electronic devices much to have a temperature higher than the surroundings in order to transfer heat by convection, radiation, and conduction. The power supplies for electronics are not 100% efficient. As such, extra heat is produced that can be detrimental to the function of the device. As such, the heat sink is included in the design to disperse heat in order to improve efficient energy use.

In the past, a variety of patents have issued relating to heat sinks. For example, U.S. Pat. No. 4,733,293, issued on Mar. 22, 1988 to T. G. Gabuzda, discloses a heat sink device for an integrated circuit package. This heat sink device has a radially-finned heat sink with a tapered base for application to surface-encumbered integrated circuit packages. The device has a patterned set of radial fin elements to which a cooling air can pass. The fin elements are mounted on a base plate. A tapered or reduced cross-sectional area of the base plate is provided in order to maximize the surface area for heat dissipation while constraining the area of attachment.

U.S. Pat. No. 4,823,869, issued on Apr. 25, 1989 to Arnold et al., teaches an improved heat sink that has a plurality of heat-conducting fans extending to form a base up heat-conductive material. The top surface of the base is peaked to reduce a dead space that would occur during vertical impingement airflow. The top surface is pyramidal in shape with the peak at the center.

U.S. Pat. No. 4,884,331, issued on Dec. 5, 1989 to H. G. Hinshaw, discloses a method of manufacturing a heat sink. This heat sink body is formed by extrusion. Parallel fins extend outwardly a predetermined distance and are separated by a number of grooves. The ratio of the height of the fins to the width of the grooves is approximately four to one. The first grooves are gang sawed to a predetermined depth.

U.S. Pat. No. 4,899,210, issued on Feb. 6, 1992 Lorenzetti et al., discloses a heat sink for use with integrated circuit elements. The heat sink includes a base adapted to be in thermal contact with the element to be cooled. There is at least one projection from the side of the base that is adapted to be adjacent to the element and a plurality of pins extending from the other side of the base in a direction substantially parallel thereto. The projection from the base may be in the form of a center pedestal that is secured to the element to be cooled.

U.S. Pat. No. 5,155,579, issued Oct. 13, 1992 to D. S. Aluyeung, shows a molded heat sink for housing semiconductor devices. Heat is removed from the semiconductor device by direct heat transfer through upstanding members integrally molded in the top of the housing. The integrally molded heat dissipation members facilitate cooling of the semiconductor die.

U.S. Pat. No. 5,369,301, issued on Nov. 29, 1994 to Hayashi et al., discloses pin-finned forged heat sink. There is a base with a plurality of pin members having a circular cross-section and extending outwardly from the base. Each of the pins has a planar top surface. The top surface of the pins is arranged in a common plane.

U.S. Pat. No. 5,437,327, issued on Aug. 1, 1995 the M. D. Chiou, shows a heat dissipating fan device that includes a radiating flange having radiating fins and mounting holes within the radiating fins. A motor mount having split bolts at the bottom are respectively fitted into the mounting holes on the radiating flange. A fan motor is mounted on the motor mount and surrounded by the radiating fins.

U.S. Pat. No. 5,499,450, issued on Mar. 19, 1996 the J. Jacoby, teaches a multiple pin heat sink device with U-shaped wire elements mechanically swaged into channels of a base element. The pins of the U-shaped wire element are introduced into respective pin-receiving holes present in the top surface of a die member to expose the central portion of each wire element. A basic element with channels that matches the arrangement of the wire elements in the die member is applied with pressure to the exposed central portions of the wire elements to effectively swage and expand the central portions of the wire elements into the corresponding matching channels in the base member for permanent attachment of the wire elements to the base element.

U.S. Pat. No. 5,597,034, issued on Jan. 28, 1997 to Barker, III et al., discloses a fan heat sink assembly so as to cool the electronic components mounted on a circuit board. The assembly includes a blower mounted on top of a specially-shaped heat sink. The heat sink has a truncated hyperbolic-shaped central member with fins radially emanating from the center. The blower draws air in through the area between the fins, up the curved central portion and into the blower assembly where it is then exited out of the sides of the fan.

U.S. Pat. No. 5,661,638, issued on Aug. 26, 1997 to A. Mira, shows a high-performance spiral heat sink. The thermally conductive heat sink has a first surface. A plurality of arc-shaped cooling fins are formed in the first surface. The arc-shaped cooling fins extend radially outwardly from a central region of the first surface. A second surface of the thermally conductive heat sink is adapted to thermally contact a heat-generating device. By contacting the heat-generating device, heat generated by the device is dissipated through the arc-shaped cooling fins.

U.S. Pat. No. 5,785,116, issued on Jul. 28, 1998 to T. R. Wagner, provides a fan-assisted heat sink device in which the heat sink assembly forms the housing surrounding the fan. The housing is constructed of a plurality of cooling vanes that have elongated openings therebetween so as to allow air to pass therebetween and cool the vanes. The vanes are angled in an approximately opposite manner to the orientation of the fan blades in order to minimize the noise generated by the cooling device when in operation.

U.S. Pat. No. 5,966,291, issued Oct. 12, 1999 to Baumel et al., discloses a power module for the control of electric motors that includes a cooling unit with a cooling medium flowing through it. The cooling unit has a heat sink with a structured surface formed as an insert section into which the underside of the substrate is fitted.

U.S. Pat. No. 5,975,194, issued on Nov. 2, 1999 to G. R. Wagner, shows a fan-assisted heat sink cooling device. The housing is constructed of a plurality of cooling vanes that have elongated openings therebetween so as to allow air to pass therebetween in order to cool the vanes. The vanes are angled in an approximately opposite manner to the orientation of the fan blades in order to minimize the noise generated by the cooling device when in operation.

U.S. Pat. No. 5,988,266, issued on Nov. 23, 1999 to Smith et al., teaches a bonded, cast, pin-finned heat sink. The heat sink has mating first and second opposite base members having first and second pin fins extending generally perpendicularly therefrom. The pin fins are generally cylindrical and each bonded into recesses formed on the opposing base member. The spaces between nearest adjacent first and second pin fins form narrow fluid passageways having a gas inlet for communicating with a heat-generating body.

U.S. Pat. No. 6,000,132, issued on Dec. 19, 1999 to J. R. S. Butler, discloses a method of forming heat-dissipating fins. This method includes the steps of providing a base plate having a plurality of grooves therein, providing a plurality of blanks each having bell-bottom-shaped foot portions on opposite sides thereof, separating each blank into a pair of mirror image heat fin portions, positioning the heat sink fin portions with the bell-bottom shaped foot portions in respective grooves of the base plate, and swaging the bell-bottom shaped foot portions into the grooves so as to create the heat sink with tongues projecting from the base plate.

U.S. Pat. No. 6,173,758, issued on Jan. 16, 2001 to Ward et al., provides a pin fin heat sink having mixed geometry pin fin configurations. The mixed geometry pin fin configuration is designed to optimize the positive attributes of each individual pin fin geometry in order to provide a low-cost system. The pin fin heat sink includes a base surface having a plurality of pins fins perpendicular to and protruding therefrom.

U.S. Pat. No. 6,196,300, issued on Mar. 6, 2001 to M. Checchatti, provides a heat sink that includes a conductive plate to be applied to the surface to be cooled. The thickness of the conductive plate gradually increases from the edges toward a central portion along a curvilinear profile having an upwardly-turned concavity. As such, an air flow hitting the plate is deflected toward the edges with a substantially horizontal outlet direction. The conductive plate has a plurality of cooling fans extending in a radial manner from the central portions toward the edges of the plate.

U.S. Pat. No. 6,360,816, issued on Mar. 26, 2002 to G. R. Wagner, discloses a cooling system for dissipating heat from a heat source. The cooling system has a heat sink associated with an air moving device. The heat sink has a core member having a first surface adapted to contact at least a portion of the heat source. The core member has at least one outer peripheral surface. The device has at least one inner peripheral surface and at least one cooling fin is associated with the core member in which the inner peripheral surface of the cooling fin is adjacent the outer peripheral surface of the core member. The air moving device is located opposite the first surface of the core member and forces air past the cooling fins in the general direction of the first surface.

U.S. Pat. No. 6,446,707, issued on Sep. 10, 2002 to J. M. White, teaches an active heat sink structure with directed airflow. Each heat sink includes a heat sink base having a top surface with a top surface periphery at a top surface center, along with an oppositely disposed bottom surface. A plurality of airflow paths are defined on the top surface of the base by fins extending perpendicularly to the top surface. Substantially all of the airflow paths direct a flow of air from the top surface center toward the top surface periphery and substantially parallel to a reference line.

U.S. Pat. No. 6,479,895, issued on Nov. 12, 2002 to Lee et al., discloses a heat dissipation system for extracting heat from an integrated circuit device. The heat dissipation system includes a thermally conductive post having substantially planar upper and lower surfaces. The upper surface is disposed across from the lower surface. The lower surface is adapted to contact the integrated circuit device. A conductive heat exchange portion includes an array of fins extending upwardly from the upper surface of the post.

U.S. Pat. No. 6,705,144, issued on Mar. 16, 2004 to Pollard I I et al., discloses a manufacturing process for a radial fin heat sink. The system includes a thermally conductive base having substantially planar upper and lower surfaces. The upper surface is disposed across from the lower surface. The lower surface is adapted to contact an integrated circuit device. The conductive heat exchange portion includes an array of fins extending angularly away from the upper surface of the base. The array has a chamber within the housing and an air movement device so that the air introduced by the air movement device creates a swirling air movement over the heat exchange portion to increase air movement around the heat exchange portion in order to enhance heat extraction.

U.S. Pat. No. 6,755,242, issued on Jun. 29, 2004 to J. M. White, shows an active heat sink structure that includes at least one heat sink. The heat sink includes a heat sink base having a top surface with a top surface periphery, a top surface center at a central portion of the top surface and an oppositely disposed bottom surface. The top surface is flat. A plurality of airflow paths are defined on the top surface of the heat sink base. These air flow paths are defined by fins extending perpendicularly to the top surface. An air-flow source, such as a fan, direct the air into the plurality of airflow paths.

U.S. Pat. No. 6,817,405, issued on Nov. 16, 2004 to Kamath et al., discloses a heat sink that has a base plate and attached pin fins with intake and discharge openings connected by a tubular channel. A pump moves cooling fluid across the exterior surface of the pin fins as well as the interior surface of the tubular channels. This serves to increase the surface area exposed to the cooling fluid.

U.S. Pat. No. 6,942,025, issued on Sep. 13, 2005 to the Nair et al., provides a uniform heat dissipating and cooling heat sink for increasing conductive cooling at locations where conductive cooling and temperature differential is reduced. The second heat sink includes a base having a variable thickness with a maximum thickness at the interior thereof and a plurality of fins upstanding from the base in which the adjacent fins are separated by a flow channel having diverging sides.

U.S. Pat. No. 7,215,545, issued on May 8, 2007 to Moghaddam et al., provides a liquid cooled heat sink for cooling integrated and power modules. The heat sink is formed of a diamond, silicon and carbide composite. The heat sink is provided with heat transfer facilitating fins and an enclosure for routing the cooling liquid into heat transfer contact with the heat sink and the fins.

U.S. Pat. No. 8,342,276, issued on Jan. 1, 2013 to T. Muakami, shows a cooling device that is used for cooling a switching module containing a switching element as a heating element. The cooling device includes a cooling liquid channel having a plurality of cooling fins through which the cooling liquid flows. The cooling fins have a cut-off portion at the position corresponding to at least a center portion of chips constituting the switching module in the flow direction of the cooling liquid.

U.S. Pat. No. 8,472,188, issued on Jun. 25, 2013 to Horichi et al., teaches a semiconductor power module including an insulated substrate with a plurality of semiconductor devices mounted thereon and a heat sink for radiating heat generated from the plurality of semiconductor devices. The heat sink is integrally molded with a plurality of radiation fins on one surface of a planar base such that a metallic material is filled into a female die and pressed by male die. The insulated substrate is bonded by metallic bonding to another surface of the base of the heat sink opposite the radiation fins.

U.S. Pat. No. 5,369,301, issued on Nov. 29, 1994 to Hayashi et al., describes a pin-finned heat sink. This heat sink has a plurality of pins in which each pin is substantially rounding cross-section.

U.S. Pat. No. 5,829,514, issued on Nov. 3, 1998 to Smith et al., describes a high-performance, high pin fin density heat sink that has mating first and second opposing base members having first and second pin fins extending generally perpendicularly therefrom. The pin fins are generally cylindrical and each bonded into recesses formed on the opposing base member. The spaces between nearest adjacent first and second pin fins form narrow fluid passageways having a gas inlet for communicating with a heat-generating body and a gas outlet and.

U.S. Patent Application Publication No. 2006/0264073, published on Nov. 23, 2006 to Yang et al., shows a planar heat dissipating device. This planar heat dissipating device has a planar housing defining a planar interspace therein and a partitioning unit dividing the interspace into a plurality of upper fluid channels and a plurality of lower fluid channels that cross the upper fluid channels. Each of the upper fluid channels is in fluid communication with at least one of the lower fluid channels at an intersection therebetween.

FIG. 3 shows the prior art heat sink that is formed by melting and casting aluminum in a sand mold for a permanent mold. The performance of the prior art heat sink of FIG. 3 is 13 deg. C./KW. The performance of the heat sink is limited by the relatively poor thermal conductivity of the dendritic structure of the cast metal as well as by the fairly large pin separation between pins required by virtue of the casting process.

FIG. 4 shows another prior art heat sink form by cross-cutting a rolled aluminum plate. Hot-rolled metal plate stock, such as 6061 aluminum, has better thermal conductivity than cast aluminum. The thermal performance is 10 deg. C./KW. It can be seen that the pins are cross-cut at 90°. Other forms could also be machined at lesser included angles. Typically, pin spacing is controlled by the dynamics of the pin cutting process. Pin spacing will typically follow the recommendation of the pin cutting process. As can be seen in FIG. 4, each of the pins has a generally diamond-shaped configuration.

It is object of the present invention to provide a heat sink for a power semiconductor module that has a large number of pins in a given area.

It is another object of the present invention to provide a heat sink for a power semiconductor module that has a large pin cross-sectional area.

It is another object the present invention provide a heat sink for a power semiconductor module that has larger surfaces in contact with the fluid passing through the heat sink.

It is another object of the present invention to provide a heat sink for a power semiconductor module that is of an improved conductive material.

It is another object of the present invention to provide a heat sink for a power semiconductor module that has a greater fluid velocity.

It is another object of the present invention to provide a heat sink for a power semiconductor module that avoids fluid recirculation.

It is still another object the present invention to provide a heat sink for a power semiconductor module that has improved heat transfer performance.

These and other objects and advantages of the present invention will become apparent from a reading of the attached specification and appended claims.

BRIEF SUMMARY OF THE INVENTION

The present invention is a power semiconductor module that comprises a base plate having a heat sink affixed thereto, a housing affixed to the base plate, a DC busbar affixed to the base plate and to the housing, an AC busbar affixed to the base plate and to the housing, on a side of the housing opposite to the DC bus bar, and control electronics positioned in an interior of the housing and connected to the DC busbar and to the AC busbar. The heat sink has a plurality of pins affixed to one side of the plate and extending therefrom. Each of the plurality of pins is forged or impact extruded. Each of the plurality of pins has an elongated cross-section of uniform thickness.

The heat sink comprises a plurality of heat sink arrays that are molten salt dipped brazed to the base plate. The base plate has a plurality of pin members extending outwardly of a surface thereof. The plurality of heat sink arrays are secured to the plurality of pin members. Each of the plurality of pins is of pure aluminum. Each of the plurality of pins has a cross-section with a first side, a second side, a first rounded end extending between the first and second sides, and a second rounded end opposite the first rounded end and extending between the first and second sides. A space between pins of the plurality of pins is less than a width dimension of each of the plurality of pins as measured between the first and second sides. The plurality of pins are in uniformly spaced relationship to each other along a common row.

The AC busbar has a heat sink mounting thereon. This heat sink mounting is affixed to the heat sink. A sealant material is applied to seams between the base plate and the housing and to seams between the DC busbar and the housing and the base plate. The sealant material is applied to seams between the AC busbar and the housing and the base plate. The sealant material is also applied such that the control electronics are in an air-tight environment within the housing.

The present invention is also a heat sink for a power semiconductor module. This heat sink comprises a base plate, and a plurality of pins affixed to the base plate and extending outwardly therefrom. Each of the plurality of pins is of a pure aluminum material and is forged or impact extruded. Each of the plurality of pins has an elongated cross-section of uniform thickness.

The heat sink for the power semiconductor module includes a plurality of heat sink arrays that are molten salt dipped brazed to the base plate. The base plate has a plurality of pin members extending outwardly of a surface thereof. The plurality of heat sink arrays are secured to the plurality of pin members. Each of the plurality of pins has a cross-section with a first side, a second side, a first rounded end extending between the first and second sides, and a second rounded end opposite the first rounded end and extending between the first and second sides. A space between pins of the plurality of pins is less than a width dimension of each the plurality pins as measured between the first and second sides. The plurality of pins are in uniformly spaced relationship to each other along a common row.

The present invention is also a method of forming a heat sink for a power semiconductor module. The method includes the steps of: (1) forming an aluminum plate having a desired thickness; (2) forging or impact extruding a plurality of pin arrays in which each of the plurality of pin arrays has a plurality of pins; and (3) affixing the plurality of pin arrays to the aluminum plate such that the plurality of pins extend outwardly of a surface of the aluminum plate.

The step of affixing includes molten salt dipped brazing the plurality of pin arrays to the aluminum plate. The aluminum plate has pin members extending outwardly therefrom. The plurality of pin arrays also includes a plurality of slots formed therein. The step of affixing includes placing the plurality of slots of the plurality of pin arrays onto the plurality of pin members of the aluminum plate. Each of the plurality of pin arrays is formed of a pure aluminum material.

This foregoing Section is intended to describe, with particularity, the preferred embodiments of the present invention. It is understood that modifications to these preferred embodiments can be made within the scope of the present claims. As such, this Section should not to be construed, in any way, as limiting of the broad scope of the present invention. The present invention should only be limited by the following claims and their legal equivalents.

DETAILED DESCRIPTION OF THE INVENTION

Figure 5:
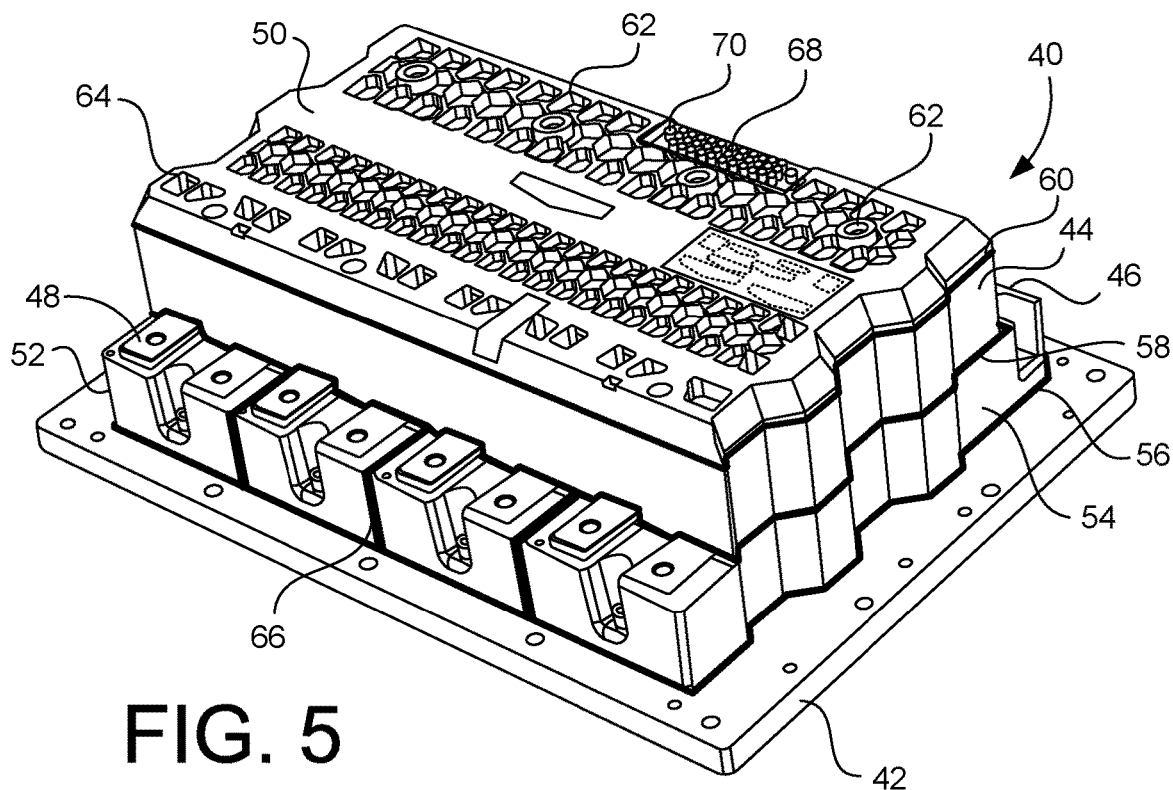
FIG. 5 is an upper perspective view of one side of the power semiconductor module with the heat sink of the present invention.

Referring to FIG. 5, there is shown the power semiconductor module 40 in accordance with the teachings of the present invention. The power semiconductor module 40 includes a base plate 42, a housing 44, an AC busbar 46, and a DC busbar 48. A lid and a plurality of supports 52 extend between the top of the base plate 42 and the DC busbar 48. A heat sink 54 is located below the housing and upon the base plate 42.

In the present invention, a sealant material is applied between the bottom of the heat sink 54 (or the bottom of the housing 44) and the top of the base plate 42. The sealant material 50 should be applied circumferentially around the bottom of the heat sink 54 or around the bottom of the housing 44. In FIG. 5, it can be seen that there is another sealant material 58 applied between the bottom of the housing 44 and the top of the heat sink 54. The sealant material 58 is also applied between the DC busbar 48 and the housing 44. The sealant material 56 and 58 is applied so that the control electronics (located within the interior of the housing 44) are maintained in an air-tight environment. Another sealant material 60 is applied between the lid 50 and the top of the housing 44. Sealant material 60 extends circumferentially around the periphery of the lid 50. The lid has a plurality of holes 62 formed therein which open to the interior of the housing 44 and to the control electronics. These holes 62 are also filled with the sealant material. Additional holes 64 are formed on the opposite side of the lid 50. Once again, sealant material is applied so as to cover these holes. The sealant material 66 is applied between the supports 52. A connector 68 is located at the top of the lid 50. A sealant material 70 also extends around the periphery of the connector 68 so as to seal any openings that might exist between the periphery of the connector 68 and the lid 50.

Figure 6:
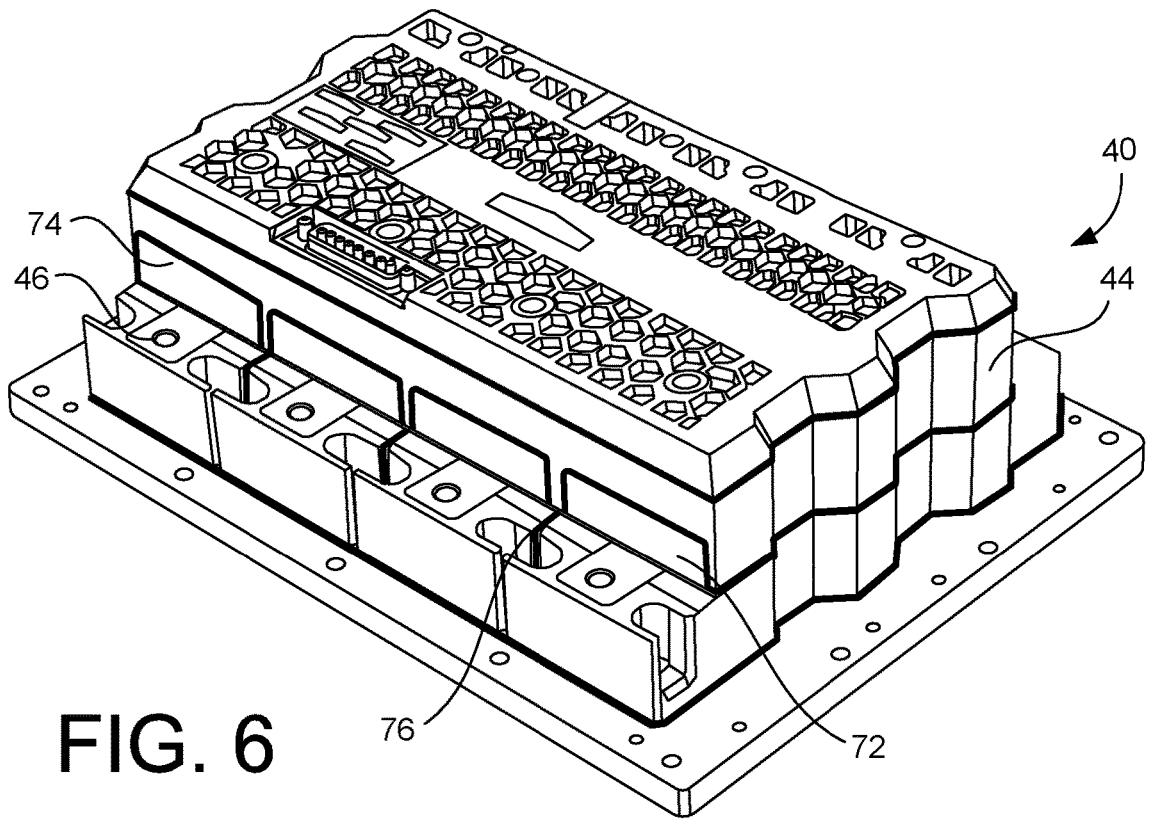
FIG. 6 is an upper perspective view of an opposite side of the power semiconductor module with the heat sink of the present invention.

FIG. 6 is an opposite view of power semiconductor module 40. In FIG. 6, the AC busbar 46 is particularly shown. Also, a plurality of plugs 72 are arranged on the side of the housing 44 adjacent to the AC busbar 46. Sealant material 74 is applied around the periphery of the plugs 72. Similarly, sealant material 76 is applied between the heat sink elements associated with the AC busbar 46. In other words, all openings to the interior of the power semiconductor module 40 are sealed with the sealant material.

Fundamentally, the sealant material used in the present invention seals all the openings, seams, crevices and holes that may exist on the power semiconductor module 40. As such, the interior of the housing is sealed and the control electronics are maintained in an air-tight environment. As a result, absolutely no condensation can occur within the interior of the housing. The trade-off is that there is little ventilation to the control electronics provided by the present invention. In the past, it was believed that it is important to provide the holes and seams in the housing and the various other elements of the power semiconductor module so that adequate ventilation can interact with the IGBTs of the power semiconductor module. In the present invention, there would be no such ventilation.

Figure 1:
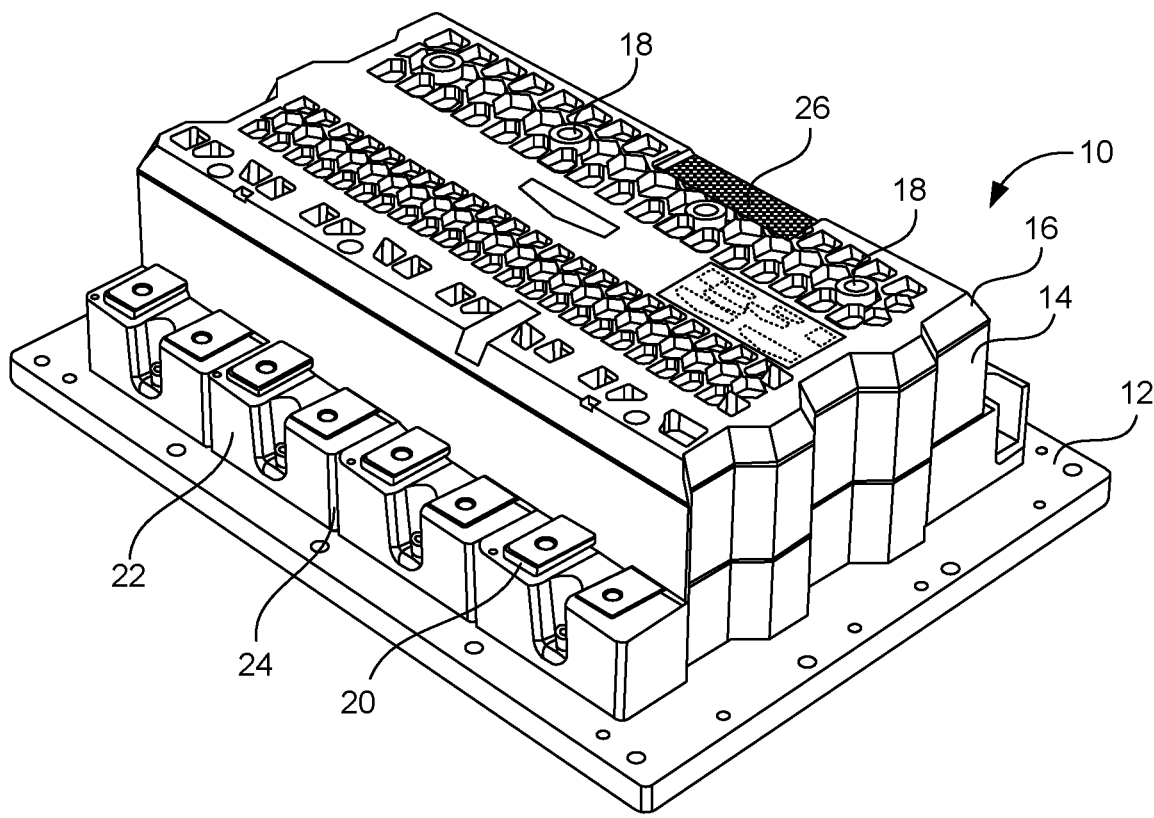
FIG. 1 is a perspective view from one side of a power semiconductor module of the prior art.
Figure 2:
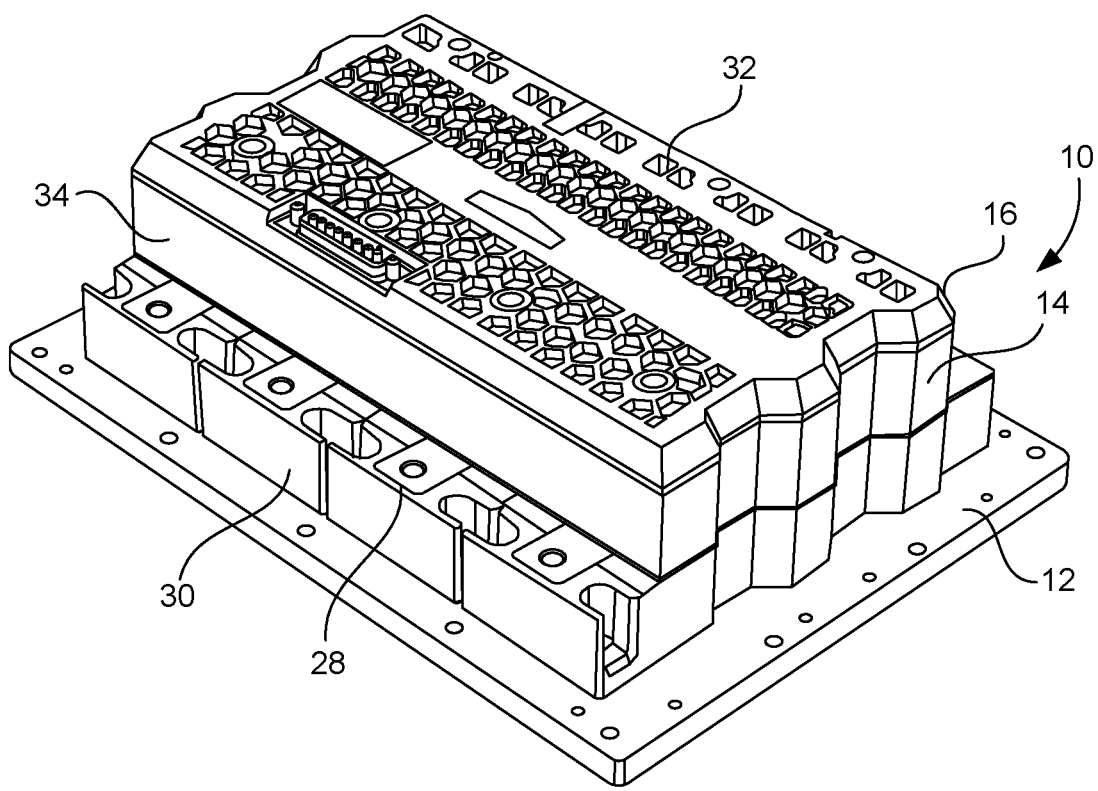
FIG. 2 is an opposite side upper perspective view of a power semiconductor module of the prior art.
Figure 3:
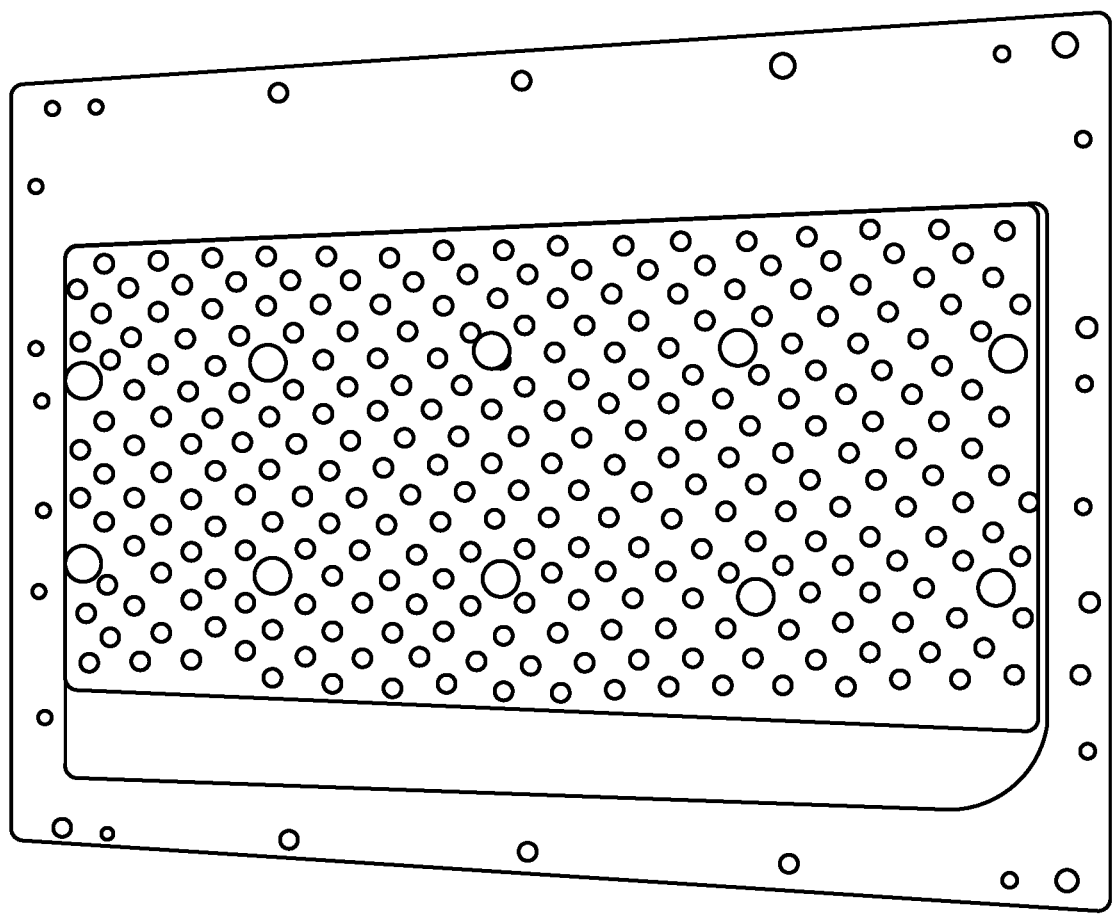
FIG. 3 is a perspective view showing a prior art heat sink as used in a power semiconductor module.
Figure 4:
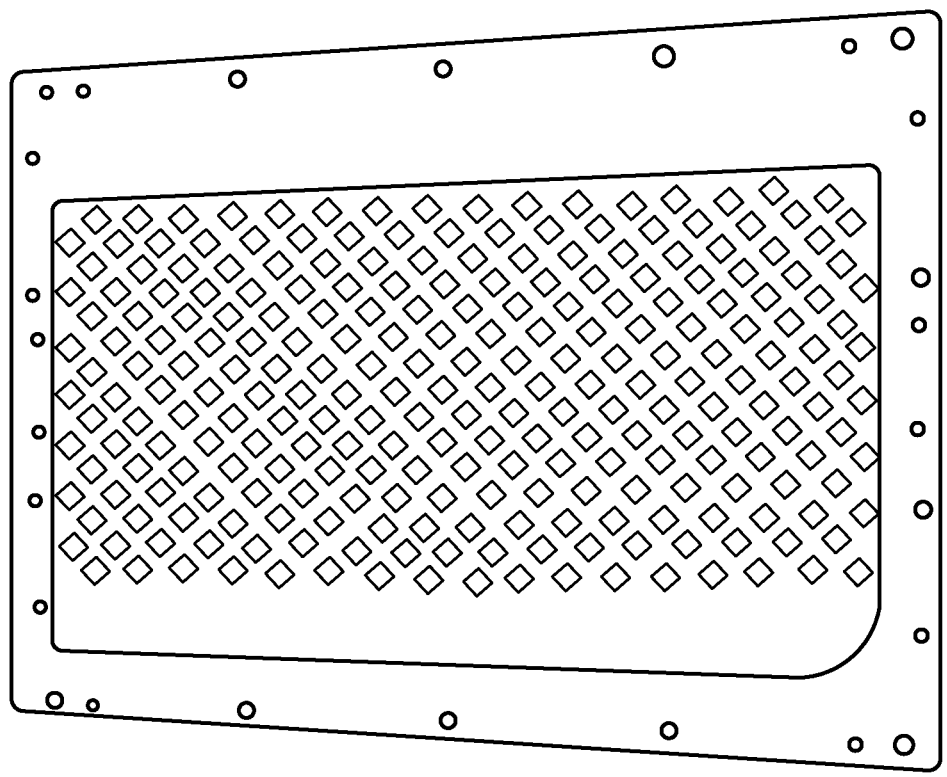
FIG. 4 is another prior art heat sink as used with the power semiconductor module.

Experiments with the present invention have shown that the power semiconductor module of the present invention exhibits an incredibly long life span even in the most condensation-causing environments. In experiments with the prior art ventilated power semiconductor module of FIGS. 1 and 2, failure, and ultimately an explosion, would occur within one hour of exposure to the condensation-causing environment. In contrast, the present invention operated for over two weeks without failure. These tests were conducted in condensation-causing environments far beyond those to which the normal power semiconductor modules would be exposed. Tests further proved that the negative effects to the IGBTs caused by the airtight environment of the control electronics was relatively minimal Ultimately, it was found that the long life within the condensation-causing environment far outweighed the small detrimental effects caused by the lack of ventilation to the IGBTs. Furthermore, the heat sink of the present invention (as will be described hereinafter) provided superior cooling effects that avoided any overheating of the control electronics caused by this air-tight and unventilated environment. Ultimately, it is believed that the power semiconductor module 40 of the present invention would have a life expectancy of approximately twenty years as opposed to the four to five year life expectancy of the prior art semiconductor module of FIGS. 1 and 2.

Figure 7:
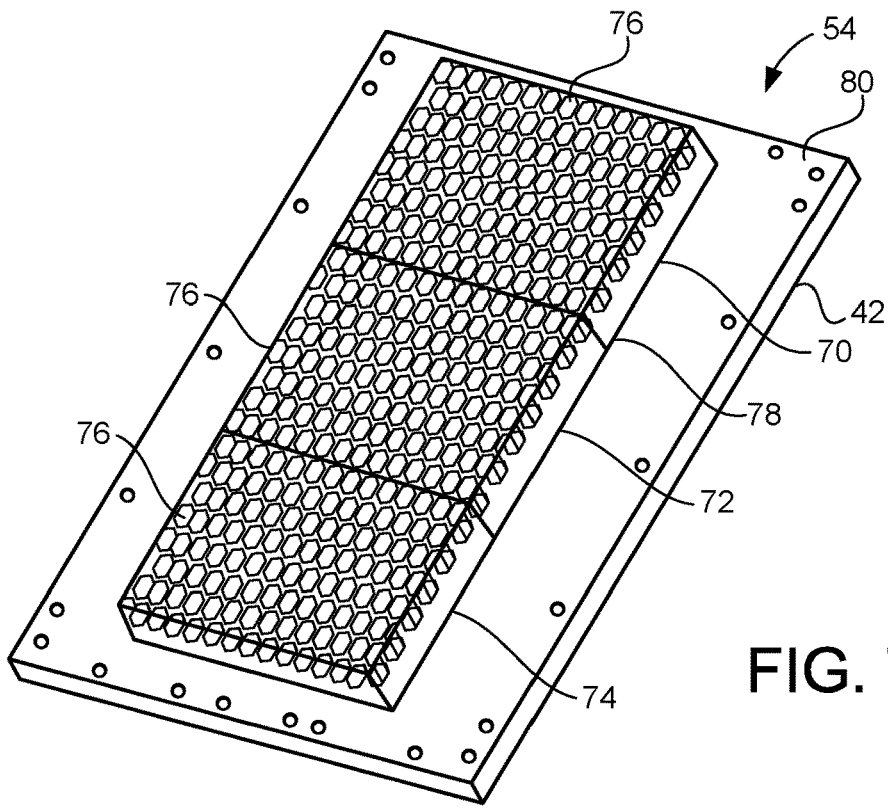
FIG. 7 is an upper perspective view of the heat sink as used with the power semiconductor module of the present invention.

FIG. 7 shows the heat sink 54 of FIGS. 5 and 6. In particular, the heat sink 54 is an enhanced heat dissipation device that allows such power semiconductor modules to be positioned on the flat external side thereof. These are coupled to the heat sink with thermal grease for a thermal joint compound. Other attachment means, such as soldering or electrically-insulating thermally-conductive pads, may also be used. The present invention can also include an enclosing and substantially planar water jacket. The heat sink 54 is bolted to the water jacket and sealed with an O-ring, a formed gasket, or similar sealing mechanisms. The jacket can include at least one heat sink. Each jacket is configured for fittings for gas inlet and egress under external pumping pressure. The jacket contains parallel planar surfaces closely spaced from the pin arrays 70, 72 and 74. Conventional heat exchangers, such as water-to-air or water-to-coolant exchangers, can form part of the cooling loop. The cooling loop can also be a vapor, such as steam, and a single pass arrangement.

In particular, the heat sink 54 includes the base plate 42 having the heat sink 54 affixed thereto. The heat sink 54 has pin arrays 70, 72 and 74 each having a plurality of pins 76. Each of the pins 76 is forged or impact extruded and of pure aluminum. It can be seen that each of the plurality of pins has an elongated cross-section of a uniform thickness. The plurality of pin arrays 70, 72 and 74 are affixed to base plate 42 by molton salt dipped brazing 78. As will be described hereinafter, the base plate 42 will have a plurality of pin members that extend outwardly of surface 80 thereof. Similarly, at least some of the pins 76 of each of the arrays 70, 72 and 74 will have a slot therein. Typically, for positioning purposes, the slots of the pins 76 will be positioned over the pin members of the base plate 42. As such, the pin arrays 70, 72 and 74 can be positioned in side-by-side relationship.

In FIG. 7, it can be seen that each of the pins 76 are of the same configuration and are uniformly spaced throughout the array. The forged or impact-extruded pin arrays 70, 72 and 74 can be joined to a machined aluminum plate 42 that constitutes the main extent of the base. This joint may or may not be needed depending on the detailed manufacturing process. Such a joint can also be a grease joint, a soldered material or a brazed material.

Figure 8:
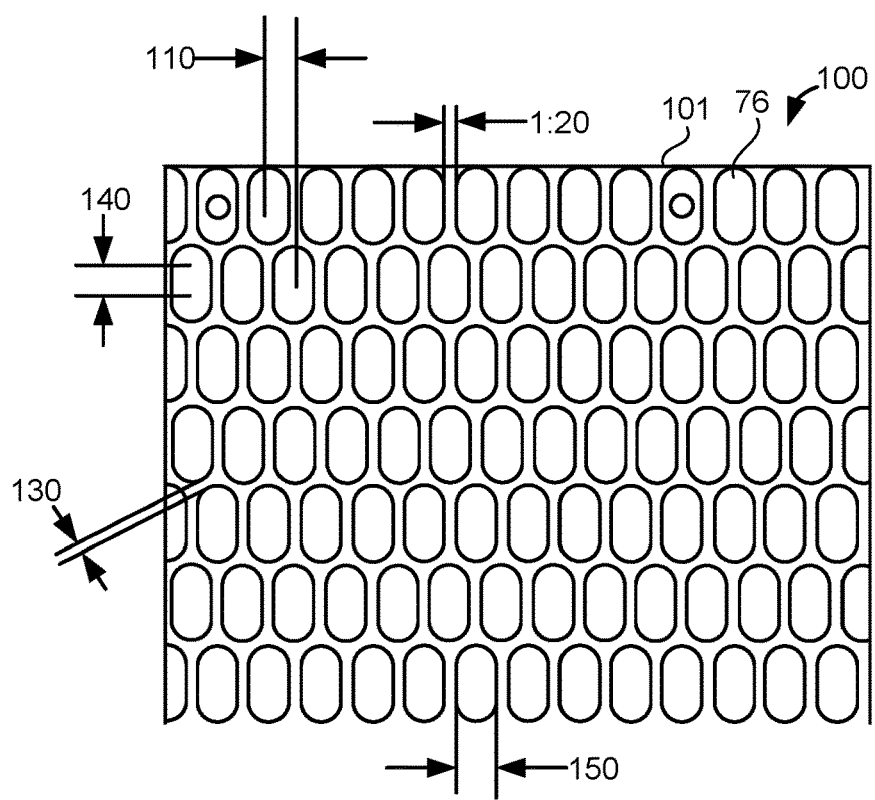
FIG. 8 is a detailed plan view of a single pin array of the heat sink of the power semiconductor module of the present invention.

FIG. 8 shows an expanded view of the pin region of the preferred embodiment of the present invention. In particular, the pin array 100 is particularly shown as affixed to plate 101. Each of the pins 76 is shown as having rounded ends and sides in parallel planar spaced relationship to each other. Each of the pins can be of a prolate ellipsoid shape. Each of the rounded ends is connected the planar sides. The pins are straight and are not tapered. The spacing 110 shows that each downstream row of pins is staggered to lie midway in the gap between the previous row of pins. The pin spacing 120 will be in the range of between 0.030 to 0.125 inches. The preferred embodiment the present invention would have pin spacing at 0.062 inches. The spacing 130 between the rounded ends along the line connecting their radii also lies in the range of 0.03 to 0.125 inches. Once again, in the preferred embodiment, this dimension will be 0.062 inches. The dimension 140 shows the elongation of the cylindrical pin. This elongation in the preferred embodiment will be approximately 0.125 inches.

Figure 9A:
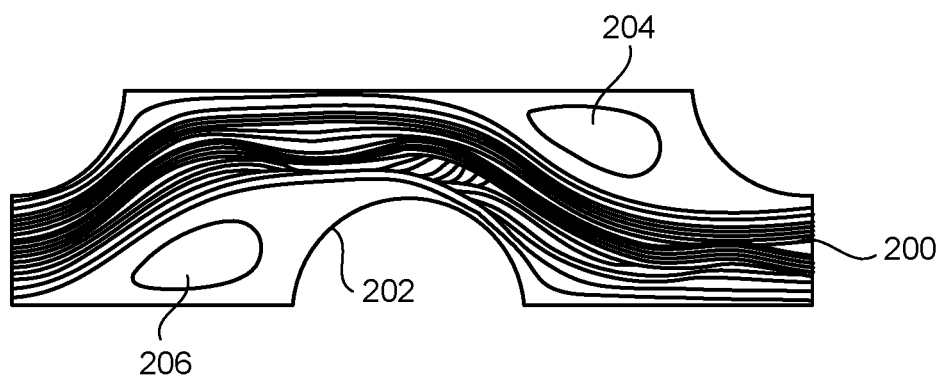
FIGS. 9A-9C show diagrammatic illustrations of fluid flow patterns between round pins, diamond pins, and elongated pins.

The prolate ellipsoid pins 76 are used to maintain the substantially laminar flow field. The dimension 150 is substantially larger than the dimension 120. For the preferred embodiment, the dimension 150 is 0.275 inches. The dimensions 140 and 150 are chosen to maximize the effectiveness of the pin consistent with the overall objective of maximizing the cooling performance of the heat sink. The flow passage dimensions 120 and 130 are chosen to utilize the available system-level liquid flow pressure drop to the maximum extent possible. FIG. 9A shows the flow pattern of fluid 200 as used with a round pin 202 of the prior art. The ovals 204 and 206 show a recirculation of the fluid 200 downstream of the pins.

Figure 9B:
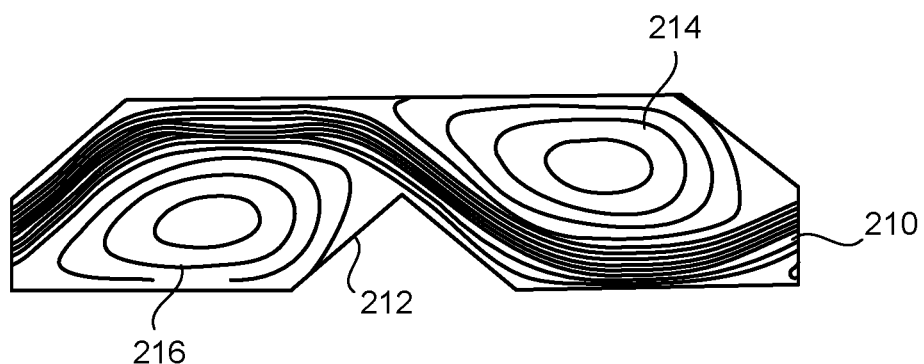
Figure 9C:
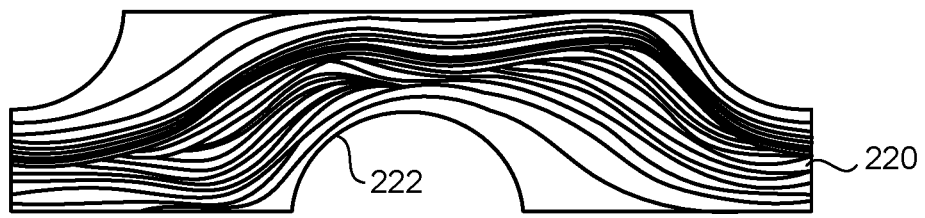

FIG. 9B shows the flow pattern of fluid 210 with respect to a diamond-shaped pin 212. Circular areas 214 and 216 show the larger, more intense recirculation areas downstream of the diamond pin 212. FIG. 9C shows the flow pattern of fluid 200 as used with the elongated pin 222 of the present invention. It can be seen that the fluid 220 is almost no recirculation downstream of the pin 222.

In normal use, fluid will pass through the fluid flow passages defined by the spaces between the pins. This fluid can be in the nature of water, glycol or a mixture thereof. The close placement of all of the pins of the particular configuration of pins, along with their staggered configuration, enhances the surface-to-surface contact between the conductive metal of the pins and the fluid. Additionally, this enhances the heat-exchange performance of the heat sink of the present invention. The elements of the heat sink of the present invention have been combined with the power semiconductor module in such a way so as to optimize the performance of the heat sink as an entirety and not just because of one or more of its individual elements. The heat sink of the present invention has been shown to increase thermal transfer by between 15 and 20%. The forging and/or impact extruding of the pure aluminum used for the pins of the present invention avoids all voids in the pins. The present invention constitutes a breakthrough in the technology to a level that was previously considered unattainable by those having ordinary skill in the art.

Experiments that have been conducted with the present invention evidence the improved thermal conductivity of the pins. In particular, the following Table I shows the thermal conductivity as between cylindrical pins of cast aluminum, diamond pins of machined aluminum, and the elongated pins of pure aluminum of the present invention:

TABLE I

Aluminum Thermal Conductivity

Changes Thermal Resistance, Rsurface-pins
Cylindrical Pins - Cast Aluminum
K = 129.8 Watts/Meter ° C.
Diamond Pins - Machined Aluminum
K = 167.0 Watts/Meter ° C.
Elongated Pins - Pure Aluminum
K = 207.7 Watts/Meter ° C.

The pin to fluid thermal resistance of is much improved by the pin arrays of present invention, as opposed to cylindrical pin arrays and diamond pin arrays. The following Table II evidences this improvement in thermal resistance:

TABLE II

Pin to Fluid Thermal Resistance $Q = \eta \, h_{pin} \, A_{surf} \, \Delta T$
$R_{pin \, to \, WEG} = \Delta T/Q$
Cylindrical Pin, $R_{pin \, to \, WEG} = 0.0055°$ C./Watt
Diamond Pin, $R_{pin \, to \, WEG} = 0.00582°$ C./Watt
Elongated Pin, $R_{pin \, to \, WEG} = 0.0023°$ C./Watt Additionally, the surface-to-fluid thermal resistance is greatly improved by the elongated pin were array of the present invention as shown in Table III hereinbelow:

TABLE III

Summary of Results

Surface to Fluid Thermal Resistance
$R_{Surface \, to \, WEG} = \Delta T/Q$
Cylindrical Pin, $R_{Surface \, to \, WEG} = 0.0103°$ C./Watt TABLE III-continued Summary of Results Diamond Pin, $R_{Surface\ to\ WEG}$ = 0.00955° C./Watt
Elongated Pin, $R_{Surface\ to\ WEG}$ = 0.00566° C./Watt The foregoing disclosure and description of the invention is illustrative and explanatory thereof. Various changes in the details of the illustrated construction can be made within the scope of the appended claims without departing from the true spirit of the invention. The present invention should only be limited by the following claims and their legal equivalents.

I claim:

1. A method of forming a heat sink for a power semiconductor module, the method comprising:

forming an aluminum plate having a desired thickness;

forging or impact extruding a plurality of pin arrays in which each of the plurality of pin arrays has a plurality of pins;

and affixing the plurality of pin arrays to the aluminum plate such that the plurality of pins extend outwardly of a side of the aluminum plate, the aluminum plate having pin members extending outwardly therefrom, the plurality of pin arrays having a plurality of slots formed therein, the step of affixing comprising: placing the plurality of slots of the plurality of pin arrays to the plurality of pin members of the aluminum plate, each of the pins having a prolate ellipsoid shape having rounded ends and sides in parallel planar spaced relationship to each other, each row of pins being staggered to lie midway in a gap between a previous row of pins, each slot of the plurality of slots being spaced from a neighboring slot by a range of 0.03 to 0.125 inches, and wherein the width of each pin is larger than the space between neighboring slots.

2. The method of claim 1, the step of affixing comprising: molten salt brazing the plurality of pin arrays to the aluminum plate.

3. The method of claim 1, wherein the plurality of pin arrays are entirely of a pure aluminum material.

* * * * *